United States Patent

Ayraud et al.

[11] Patent Number: 5,305,243
[45] Date of Patent: Apr. 19, 1994

[54] METHOD AND DEVICE FOR COMPARING TWO VARIABLE ANALOGUE SIGNALS

[75] Inventors: Michel Ayraud, Nice; Mario D'Amico, Puyricard; Gérard Pelous, Aix-en-Provence, all of France

[73] Assignee: Bertin & Cie, Plaisir Cedex, France

[21] Appl. No.: 741,391

[22] PCT Filed: Nov. 28, 1990

[86] PCT No.: PCT/FR90/00863
§ 371 Date: Sep. 10, 1991
§ 102(e) Date: Sep. 10, 1991

[87] PCT Pub. No.: WO91/08493
PCT Pub. Date: Jun. 13, 1991

[30] Foreign Application Priority Data
Dec. 1, 1989 [FR] France .................. 89 15906

[51] Int. Cl.$^5$ ............................... G06J 1/00
[52] U.S. Cl. ................................. 364/604
[58] Field of Search ........... 364/604, 728.03, 819

[56] References Cited

U.S. PATENT DOCUMENTS

| | | | |
|---|---|---|---|
| 3,961,172 | 6/1976 | Hutcheon | 364/819 |
| 4,025,775 | 5/1977 | Beauvais et al. | 364/728.03 |
| 4,224,679 | 9/1980 | Nossen et al. | 364/728.03 |

FOREIGN PATENT DOCUMENTS
0194643 9/1986 European Pat. Off. ........ 364/728.03

OTHER PUBLICATIONS
IBM Technical Disclosure Bulletin, vol. 23, No. 9, Feb. 1981, pp. 4115-4116.
Wescon Technical Papers, Oct. 30-Nov. 2, 1984, pp. 52-56.
Onde Electrique, vol. 63, No. 6/7. Jun.-Jul. 1983, pp. 52-56.

*Primary Examiner*—Long T. Nguyen
*Attorney, Agent, or Firm*—Lackenbach Siegel Marzullo Aronson & Greenspan

[57] ABSTRACT

A device compares two variable analogue signal, e.g. varying in time, such as audio or video signals. The signals, which are either different or identical but shifted in time, are within a predetermined frequency range. The device includes two parallel channels for processing analogue signals. One of the channels introduces a time shift of one signal with respect to the other, the shift being equal to a ¼ period at the center frequency of the band. Both channels include in series circuits for transforming the analogue signals into binary logic signals, a logic circuit, a summing circuit for establishing a first and second correlation signal. An adder adds the absolute values of the first and second correlation signals to form a third correlation signal that is substantially independent of any time shift between the analogue signals.

14 Claims, 3 Drawing Sheets

METHOD AND DEVICE FOR COMPARING TWO VARIABLE ANALOGUE SIGNALS

BACKGROUND OF THE INVENTION

1. Field of The Invention

The invention concerns a method and device for comparing two variable analogue signals, e.g. varying in time, such as audio or video signals, these signals being either different or identical but shifted in time.

2. Description of Related Art

To compare two variable analogue signals, a correlation function must be determined between these signals and the values of this function used to verify whether or not identity exists between the signals.

The correlation function is determined by numerical computation methods and implies use of sharp cut-off bandpass filters, analogue-to-digital converters, a system for processing information allowing real-time computation of the correlation function; and a complex processing algorithm capable of identifying and compensating for any shift between the two signals. Systems designed to perform this computation are generally fairly expensive.

Other various devices are used that measure the phase shift between two sine-wave analogue signals of the same frequency. However, these devices cannot be used for signals that are not purely sine-wave, such as audio or video signals received or produced by radio and television receivers.

SUMMARY OF THE INVENTION

The main objective of the invention is to simplify the above-mentioned numerical computation methods and systems, thereby significantly reducing their cost while retaining the desired speed and accuracy for establishing the correlation.

Another objective of the invention is to provide a correlation measurement between two analogue signals of the above-mentioned type, but which does not require a time or phase measurement.

For this purpose, the invention provides a method for comparing two variable analogue signals that consists in establishing a correlation signal between the analogue signals, and in using the values of this signal to verify whether or not identity exists between the analogue signals. The signals to be compared are either identical but shifted in time, or different, and cover a predetermined frequency range, it consists in:

transforming the said analogue signals into binary logic signals in order to present these binary signals to the inputs of an exclusive OR or multiplier type logic circuit (32), and then implementing a summing function on the output signal from this logic circuit to provide a first correlation signal S1, also in performing these operations on the said analogue signals after shifting one of them by a quarter period at the centre frequency of the abovementioned frequency band to provide a second correlation signal S2, and in summing the absolute values of first and second correlation signals to provide a third correlation signal S that is virtually independent of any time shift between the above-mentioned analogue signals.

Transforming analogue signals into binary logic signals (for which only two distinct values are possible) makes it possible to work on a single bit, and to subsequently employ a logic operator to perform the correlation between the signals. Compared to traditional numerical computation methods, this greatly simplifies the correlation method. In addition, the third correlation signal obtained is virtually independent of the time shift between the signals, and does not require the time shift to be measured.

Through another characteristic of the invention, this method can also be used to transform each analogue signal into a binary logic signal by detecting zero passings of the analogue signal, and in assigning a first logic value to the signal when it is positive, and a second when it is negative.

Detecting zero passings of the analogue signals provides a simple means of obtaining an excellent dynamic range (approximately 60 to 80 dB), which would correspond to at least a resolution of 12 bits in known numerical computation methods.

Through another characteristic of the invention, the method consists also in connecting the output of the logic circuit to a low-pass filter to perform the above-mentioned summing function.

The invention also proposes a device for comparing two variable analogue signals, comprising means for establishing a correlation signal between these two analogue signals and comparing this signal with a predetermined value in order to verify whether or not identity exists between the analogue signals; characterized in that these analogue signals being either identical and shifted in time, or different, and covering a predetermined frequency band, the device comprises two analogue signal processing channels of which one comprises means for shifting one of the signals in time with respect to the other, this shift being equal to a ¼ period at the centre frequency of the above-mentioned frequency band, each channel comprising in series converter circuits for transforming analogue signals into binary logic signals, a multiplier or exclusive OR type logic circuit, a summing circuit for establishing the S1, S2 correlation signal, and a circuit for adding the absolute values of the S1 and S2 correlation signals at the output of which appears a correlation signal S that is virtually independent of any time shift between the above-mentioned analogue signals.

A low-pass filter at the output of each logic circuit provides a means of obtaining the value of the S1, S2 correlation signal corresponding to a given shift between the analogue signals.

Deriving the absolute value of correlation signals S1 and S2 and adding their absolute values makes it unnecessary to deal with this shift between the two signals.

As an added advantage, the output of the adding circuit can be connected to the input of a low-pass filter thereby smoothing the correlation signal.

This overcomes the drawbacks associated with comparing these signals at moments when their values are very low.

Preferably, the invention provides for the input side of the device to include analogue signal level matching circuits, such as automatic gain control circuits and bandpass filters.

The means for transforming analogue signals into binary logic signals are, as an added advantage, circuits for comparing analogue signals to a given value, particularly zero. They detect zero passings of analogue signals and assign one of two binary values to these signals depending on whether they are positive or negative.

The cost of a device produced according to the invention is generally much lower than that of traditional devices for numerical computation of a correlation function, and its performance is excellent.

BRIEF DESCRIPTION OF THE DRAWINGS

The invention will be better understood and other characteristics, details and benefits will become more apparent on reading the following description, given as an example in reference to the drawings in which.

DESCRIPTION OF THE PREFERRED EMBODIMENTS

Figure 1:
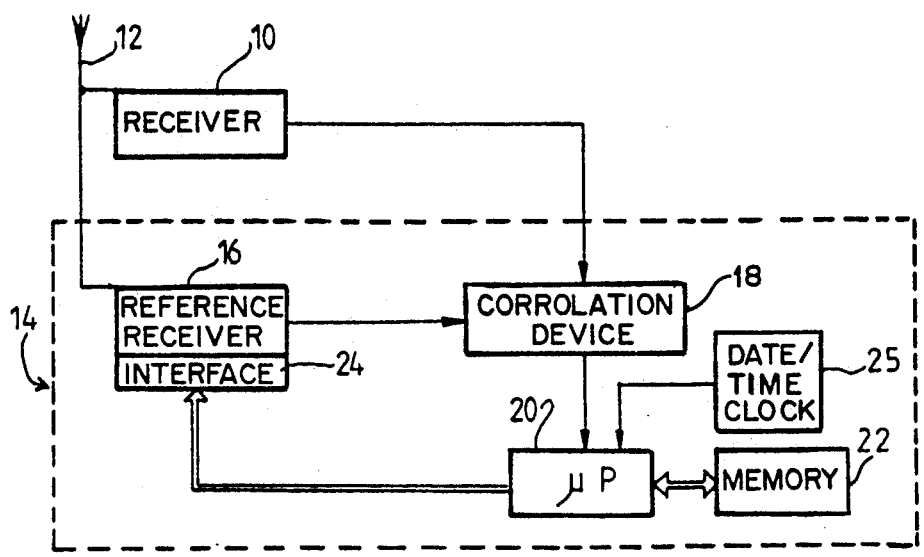
FIG. 1 represents a schematic diagram of an application example of the correlation device produced according to the invention.

To better understand the merits of the invention, we will refer first to FIG. 1, showing a schematic diagram of an application example of the method and device produced according to the invention.

Reference 10 designates a radio or television receiver connected to an antenna 12 and associated with an apparatus 14 for detecting the frequency to which receiver 10 is tuned.

Apparatus 14 comprises a reference receiver 16 also connected to antenna 12, a correlation device 18 according to the invention, an information processing microprocessor 20, a data recording memory 22, an electronic interface circuit 24 to control receiver 16 on command of microprocessor 20, and a date-time clock 25.

The outputs from receivers 10 and 16 are connected to the inputs of correlation device 18 whose output in turn is connected to an input of microprocessor 20. The microprocessor, via interface 24, systematically scans the frequencies received by reference receiver 16 whose output signals are compared to those from receiver 10 by device 18. Correlation between these signals confirms that receivers 10 and 16 are tuned to the same frequency. The correlation dates and corresponding frequencies are recorded in memory 22 and can later be extracted and used.

Figure 2:
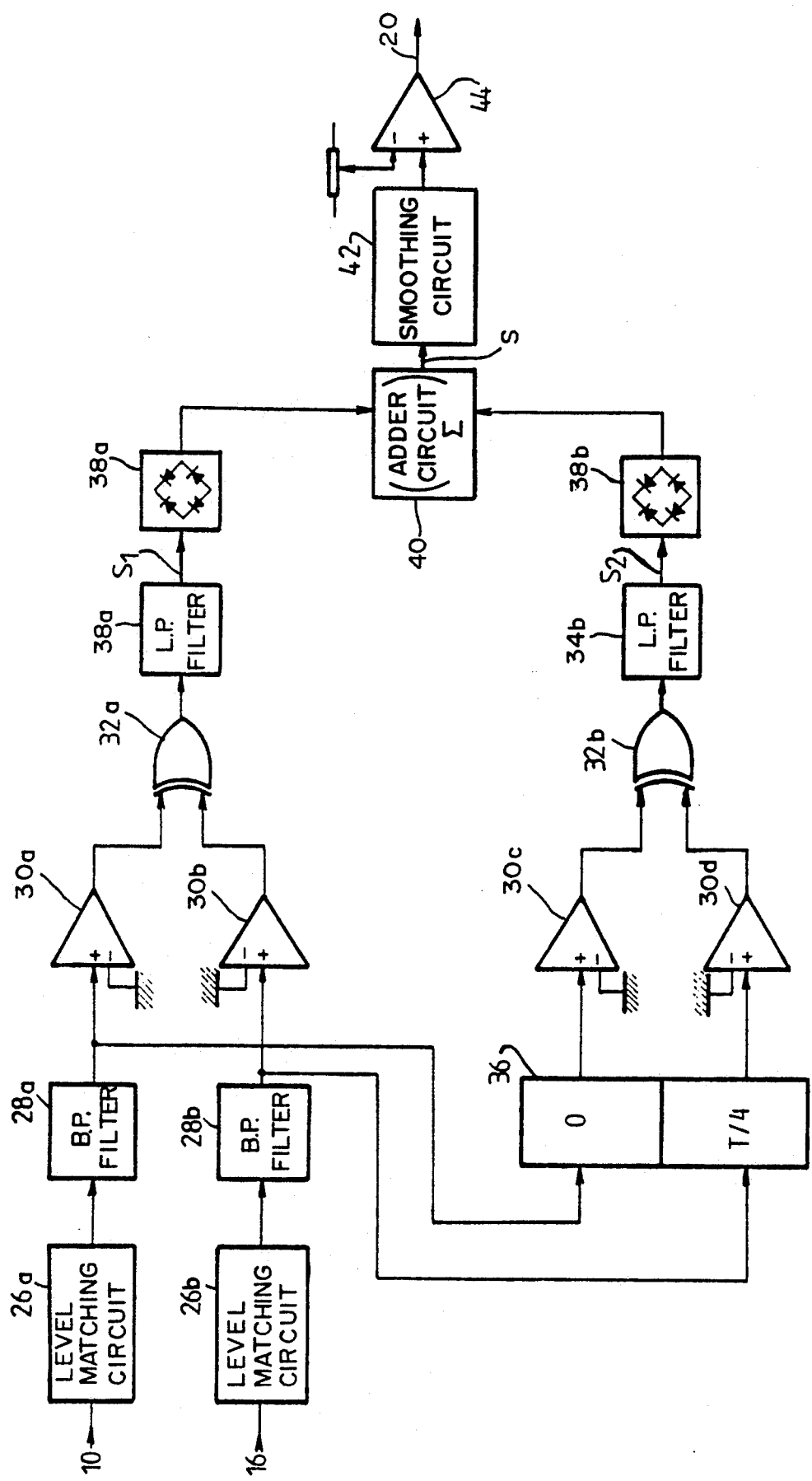
FIG. 2 represents a schematic diagram of the essential circuit elements or components of the device produced according to the invention.

FIG. 2 represents a schematic diagram of a correlation device 18 according to the invention.

In this device, the audio and video signals produced by receivers 10 and 16 are fed to input circuits comprising in particular level matching circuits 26a, 26b such as automatic gain control circuits, providing analogue signals of given maximum voltage levels, and bandpass filters 28a, 28b that limit the frequency range of the signals to a preset band.

The bandwidth of filters 28a, 28b is, for instance, an octave or more (for example 500–1000 Hz) for audio signals and 500 kHz to 1 MHz for video signals.

The output of each filter 28a, 28b is fed to the input of a circuit that converts analogue signals into binary logic signals by comparison with a preset value, preferably zero. Circuits 30a, 30b can therefore be very simple comparators, whose positive inputs receive the output signals from filters 28a, 28b whose negative inputs are connected to earth.

The outputs of the two comparators 30a, 30b are connected to the tow inputs of an exclusive OR logic circuit 32a which provides a binary logic signal at its output. The level of this output is high (for example 1) when both input signal are identical, and low (0 or −1) when the two input signals are different. The function of circuit 32a is therefore equivalent to logic multiplication.

The output of circuit 32a is connected to a low-pass filter 34a which sums the output signals from the logic circuit 32a and produces a correlation signal between the signals to be compared.

We know that correlation function is of the type given by the following equation:

$$C(\tau) = \sum_i x(i)\, y(i + \tau)$$

where x (i) and y are the signals to be compared,
$\tau$ is the shift between the signals.

Circuit 34a allows us to obtain this correlation function for a zero shift value between the signals. We therefore obtain at the output of circuit 34a a signal S1 which equals correlation signal S0 between the signals to be compared when their shift is zero, and is lower than this signal when a shift exists between the signals to be compared.

Figure 3:
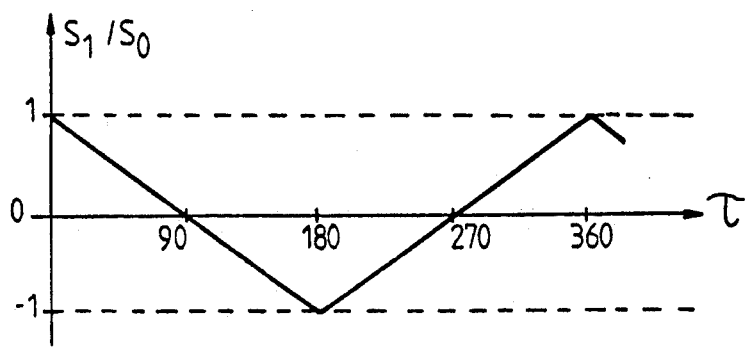
FIGS. 3, 4 and 5 are graphs showing variations in the correlation signal as a function of the time shift between the two analogue signals compared.

Variation in the S1/S0 ratio as a function of a shift between the signals to be compared is shown in FIG. 3.

It can be seen that this ratio is 1 for a shift equal to zero or to a multiple of $2\pi$, 0 for a shift of 90°, 270°, etc., and −1 for a shift of $\pi$, $3\pi$, etc. (variation of the ratio between the values 1 and −1 presupposes that the binary values of the output signal from logic circuit 32a are 1 and −1).

Figure 4:
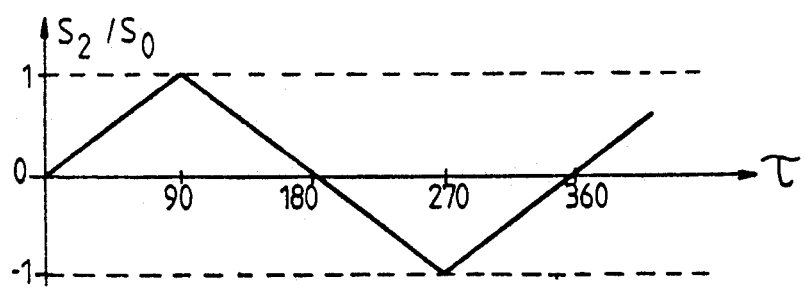

It can be seen from the graph in FIG. 3 that correlation is totally lost at the output of circuit 34 when the shift between the signals to be compared is in the region of $\pi/2$, $3\pi 2$, etc. This drawback can be eliminated by shifting one of the analogue signals by 90° and making a second comparison. Accordingly, in the invention (FIG. 2) the outputs of circuits 28a, 28b are connected to the inputs of circuit 36 which adds a quarter period shift T/4 at the center frequency of the passband of filters 28a, 28b to one of the analogue signals with respect to the other. The outputs of circuit 36 are connected to the positive inputs of comparators 30c, 30d whose outputs are connected to the inputs of a 32b logic circuit identical to circuit 32a described earlier. The output of this logic circuit is connected to the input of a low-pass filter 34b whose output signal S2 is comparable to the above-mentioned output signal S1, but shifted with respect to it. Variation in the S2/S0 ratio as a function of phase shifts between the signals to be compared is shown in the graph in FIG. 4.

It can be seen that by simply adding the absolute values of ratios S1/S0 and S2/S0 to each other, we obtain a constant ratio of 1 whatever the shift between the signals to be compared.

Figure 5:
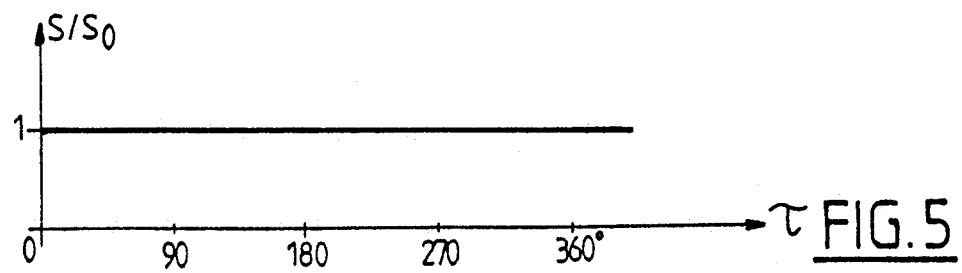

According to the invention, the outputs of filters 34a, 34b are therefore connected ro the inputs of circuits 38a, 38b which produce absolute values (full-wave rectifiers for example) whose outputs are connected to the inputs of an adding circuit 40. The output signal S from circuit 40 is a correlation signal which is substantially independent of the shift between the signals to be compared; the variation in its ratio to correlation signal S0 is shown in FIG. 5.

This signal S can be applied to the input of a smoothing circuit 42 such as a low-pass filter, whose output is connected to the positive input of a comparator 4. The negative input of this comparator receives a voltage of a preset value to which the output signal from circuit 42 is compared. The output signal from comparator 44 can be fed to an input of microprocessor 20 in apparatus 14 shown in FIG. 1.

The device functions according to the description given above:

the audio or video signals produced by receivers 10 and 16 are fed to level matching circuits 6, processed by bandpass filters 28 and then transformed into binary logical signals by comparators 30. They are then mutually compared by logic circuit 32, the first time directly, and a second time after one of the signals has been shifted by a quarter period at the center frequency of the passband of filters 28. Correlation signals are established by low-pass filters 34, and their absolute values added to provide a correlation signal that is substantially independent of the offset between the initial analogue signals This correlation signal is then smoothed and compared with a preset value. If it is higher than this value, the analogue signals are considered to be identical, whereas they will be considered to be different if the correlation signal is lower than the preset value.

The correlation device, whose essential components are shown in FIG. 2, is therefore relatively simple and offers the considerable advantage of working on a single bit, unlike comparable numerical computation systems derived from earlier technology which generally function with a digital resolution of 8 or 16 bits.

Figure 6:
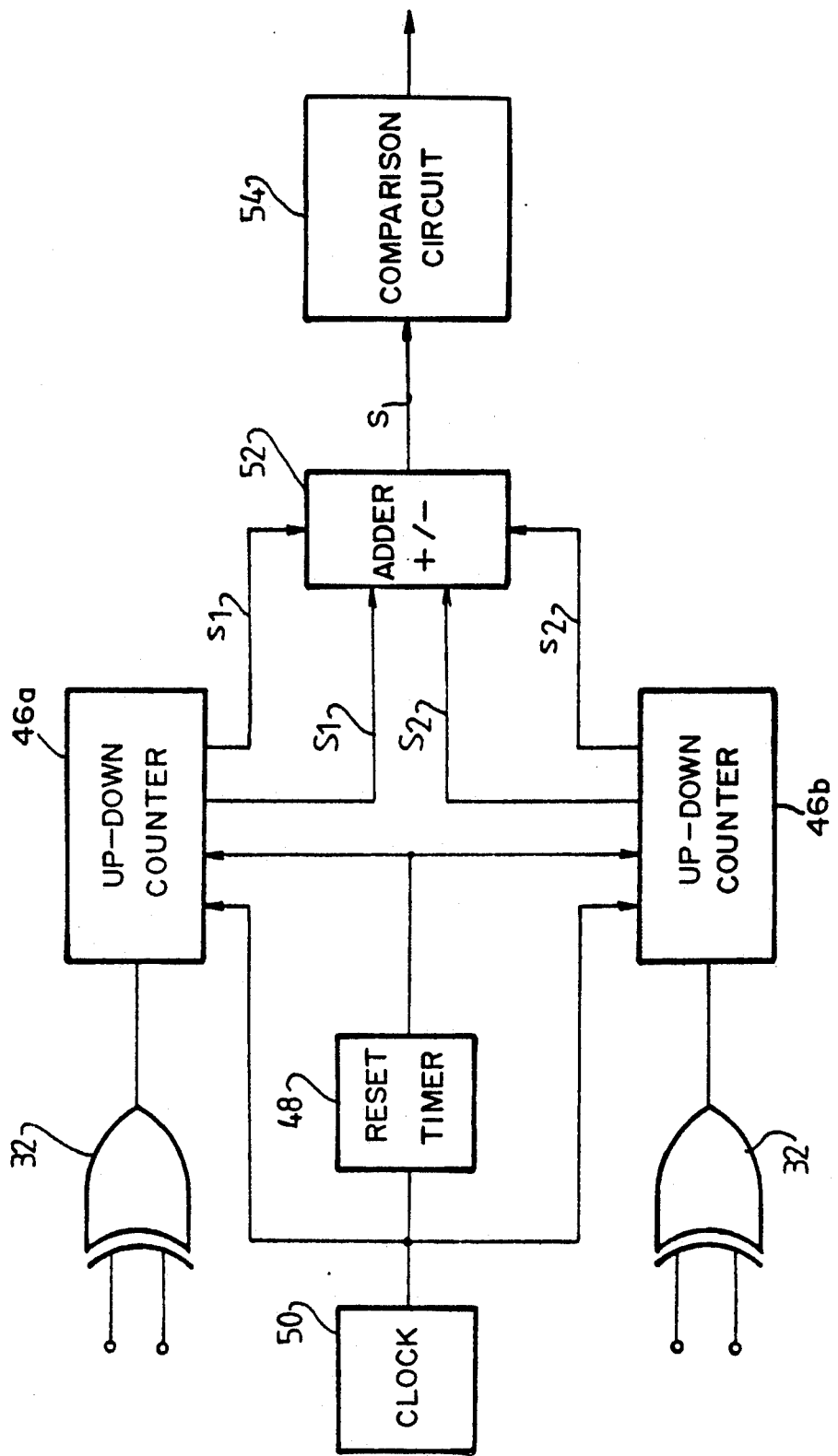
FIG. 6 represents a schematic diagram of a development variant of the device according or the invention.

A schematic of a development variant is shown in FIG. 6. In this variant, the output of each, exclusive OR circuit 32 drives up-down counters 46a, 46b which up-count when the output signal from a circuit 32 is at the +1 level, and down-count when it is at the −1 level. The up-down counter circuits 46a,46b are periodically reset by a timer circuit 48 and associated clock 50. At the end of time T, the sum of the absolute values of the contents of the two circuits 46a, 46b are calculated by an adder circuit 52 and compared by a circuit 54 to a double threshold (thresholds symmetrical with respect to zero). The output of comparator 54 provides a correlation or non-correlation decision signal between the initial analogue signals.

Adder circuit 52 sums the S1 and S2 signals of circuits 46a, 46b when they are of the same sign, and subtracts them when they are of opposite signs. This function is commanded by sign bits s1 and s2 of signals S1 and S2.

The invention is of course applicable to other analogue signals besides audio and video signals, and it is also applicable to analogue signals varying in function of a parameter other that time.

What is claimed is:

1. A method for comparing two variable analogue signals covering a determined frequency band, the method comprising the steps of:

transforming the analogue signals into binary logic signals, applying the latter to inputs of an exclusive OR logic circuit for producing an output signal, then applying a summing function to said output signal so as to obtain a first correlation signal, performing the aforementioned operations on the analogue signals after shifting one of them by a ¼ period at the center frequency of said frequency band so as to obtain a second correlation signal, and obtaining absolute values of the first and second correlation signals and summing said absolute values so as to obtain a third correlation signal that is substantially independent of any time shift between the analogue signals.

2. A method according to claim 1, further consisting of step of smoothing the third correlation signal before comparing ti to a preset value to verify identity between the analogue signals.

3. A method according to claim 1, wherein said step of transforming includes the steps of selecting said frequency band within a frequency range covered by the analogue signals, and in considering only variations of sad analogue signals within said frequency band.

4. A method according to claim 1, further consisting of step of transforming each analogue signal into a binary logic signal by detecting zero passings of said analogue signal, and by assigning a first logical value to said analogue signal when it is positive and a second logical value when it is negative.

5. A method according to claim 1, further consisting of a step of applying the output signal of the logic circuit to a low-pass filter to achieve said summing function, 6. A method according to claim 1, further consisting of a step of applying the output signal of the logic circuit to an up-down counter to achieve said summing function.

7. A method according to claim 1, wherein the analogue signals to be compared are signals produced by receivers.

8. A device for comparing two variable analogue signals covering a preset frequency band, the device comprising two parallel channels for processing the analogue signals, one of said channels comprising means for introducing a time shift on one analogue signal with respect to the other, this shift being equal to a ¼ period at the center frequency of the above-mentioned frequency band, each of said parallel channels including transforming circuits for transforming said analogue signals into binary logic signals, an exclusive OR logic circuit, connected to said transforming circuits, a summing circuit connected to said exclusive OR logic circuit for establishing one of said first and second correlation signals respectively, and an absolute value circuit connected to said summing circuit for establishing absolute values of said correlation signals; and an adder circuit for adding said absolute values obtained from said first and second correlation signals and producing a third correlation signal that is substantially independent of any time shift between the analogue signals.

9. A device according to claim 8, wherein said adder circuit si connected to a low-pass filter that smooths said third correlation signal.

10. A device according to claim 9, further comprising an output circuit connected to said low-pass filter for comparing the third correlation signal with a preset threshold.

11. A device according to claim 8, wherein said summing circuits for establishing said first and second correlation signals are each low-pass filters having an output connected to a full-wave rectifier.

12. A device according to claim 8, further comprising input circuits comprising level matching circuits connected to receiver and references sources for generating said analogue signals; and bandpass filters connected to said level matching circuits and having a passband corresponding to the above-mentioned preset frequency band.

13. A device according to claim 8, wherein the circuit for establishing each first and second correlation signal is an up-down counter having an input connected to a periodic reset circuit.

14. A device according to claim 8, wherein the binary logic signal transforming circuits comprise circuits for comparing analogue signals with a zero value.

* * * * *